United States Patent
Goeritz

(10) Patent No.: US 11,519,972 B2
(45) Date of Patent: Dec. 6, 2022

(54) METHOD AS WELL AS SYSTEM FOR PREDICTIVE MAINTENANCE OF AN AMPLIFIER MODULE

(71) Applicant: Rohde & Schwarz GmbH & Co. KG, Munich (DE)

(72) Inventor: Raimon Goeritz, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 513 days.

(21) Appl. No.: 16/675,822

(22) Filed: Nov. 6, 2019

(65) Prior Publication Data

US 2020/0141992 A1    May 7, 2020

(30) Foreign Application Priority Data

Nov. 7, 2018 (EP) ..................... 18204941

(51) Int. Cl.
| | |
|---|---|
| H03F 1/32 | (2006.01) |
| G01R 31/50 | (2020.01) |
| G01K 13/00 | (2021.01) |
| H03F 3/193 | (2006.01) |
| G01R 13/02 | (2006.01) |

(52) U.S. Cl.
CPC .............. *G01R 31/50* (2020.01); *G01K 13/00* (2013.01); *H03F 3/193* (2013.01); *G01R 13/02* (2013.01); *H03F 2200/451* (2013.01); *H03F 2200/462* (2013.01); *H03F 2200/468* (2013.01)

(58) Field of Classification Search
CPC .............................. H03F 2200/393; H03F 1/32
USPC .............................................. 330/2, 4.5, 149
See application file for complete search history.

(56) References Cited

U.S. PATENT DOCUMENTS

| | | | |
|---|---|---|---|
| 9,385,668 B2* | 7/2016 | Blair | ..................... H03F 1/0211 |
| 9,613,947 B2* | 4/2017 | Reed | ........................ H03F 3/211 |
| 2010/0271957 A1 | 10/2010 | Stapleton et al. | |
| 2011/0051785 A1 | 3/2011 | Kenington et al. | |
| 2016/0327606 A1 | 11/2016 | Van Wieringen | |
| 2018/0062729 A1 | 3/2018 | Linehan et al. | |

FOREIGN PATENT DOCUMENTS

JP    2001007770 A    1/2001

\* cited by examiner

*Primary Examiner* — Henry Choe
(74) *Attorney, Agent, or Firm* — Christensen O'Connor Johnson Kindness PLLC

(57) ABSTRACT

A method for performing predictive maintenance of an amplifier module is described. At least one parameter of at least one amplifier module is acquired via a measurement data acquisition unit. The at least one parameter acquired is analyzed via a measurement data analyzing unit so as to predict the probability and/or time of default of the at least one amplifier module. Further, a system is described.

19 Claims, 2 Drawing Sheets

METHOD AS WELL AS SYSTEM FOR PREDICTIVE MAINTENANCE OF AN AMPLIFIER MODULE

FIELD OF THE DISCLOSURE

Embodiments of the present disclosure relate to a method for performing predictive maintenance of an amplifier module. Further, embodiments of the present disclosure relate to a system for predictive maintenance of an amplifier module.

BACKGROUND

Amplifier modules are generally used for amplifying a signal received, for instance the power, the time-varying voltage or rather the current of the signal received. For this purpose, the respective amplifier module typically comprises a transistor being a component of the amplifier module. The amplifier module itself may be part of a superior amplifier system that comprises several amplifier modules or rather amplifier devices housing several amplifier modules. Each of the amplifier modules or rather amplifier devices comprise electrical circuits with components used for amplifying the respective signal processed.

Thus, each component of the amplifier module(s) may degrade over time until the respective component and, therefore, the amplifier module comprising the respective component fails. The default or failure results in a downtime of the amplifier module. Typically, the user of the amplifier module or rather the superior amplifier system reacts on the occurring default detected by ordering the respective spare part that should replace the failed one of the amplifier module. However, this yields in a relative long downtime of the amplifier module or rather the superior amplifier system since the new component, namely the spare part, replacing the fault one has to be shipped to the user of the amplifier module or rather the superior amplifier system.

SUMMARY

Accordingly, there is a need for a possibility to reduce the downtime of an amplifier module or rather a superior amplifier system in a cost-efficient and simple manner.

Embodiments of the present disclosure provide a method for performing predictive maintenance of an amplifier module. In one embodiment, the method comprises the following steps:

acquiring at least one parameter of at least one amplifier module via a measurement data acquisition unit, and analyzing the at least one parameter acquired via a measurement data analyzing unit so as to predict the probability and/or time of default of the at least one amplifier module.

Further, embodiments of the present disclosure provide a system for predictive maintenance of an amplifier module. In an embodiment, the system comprises at least one measurement data acquisition unit, at least one measurement data analyzing unit as well as at least one amplifier module, wherein the at least one measurement data acquisition unit and the at least one measurement data analyzing unit are configured to communicate with each other, wherein the at least one measurement data acquisition unit is configured to acquire at least one parameter of the at least one amplifier module, and wherein the at least one measurement data analyzing unit is configured to receive and to analyze the at least one parameter acquired so as to predict the probability and/or time of default of the at least one amplifier module.

Accordingly, the downtime of the amplifier module or rather the downtime of a superior amplifier system comprising the at least one amplifier module can be minimized since a user of the respective amplifier module is enabled to act proactively instead of reacting on a failure that has already occurred. The disclosure ensures that the probability and/or time of default of the at least one amplifier module can be predicted by taking at least one parameter of the amplifier module into account that has been acquired previously so that a predictive maintenance for the amplifier module is provided.

For instance, the at least one amplifier module may be configured to communicate with the at least one measurement data acquisition unit so as to transmit the at least one parameter. Thus, the measurement data acquisition unit receives the at least one parameter that may be actively transmitted to the measurement data acquisition unit by the amplifier module. For instance, a communication according to message queuing telemetry transport (MQTT) protocol is used.

Furthermore, the respective parameter may only be transmitted by the amplifier module provided that its value has changed. This reduces the power consumption as well as the required computational power significantly.

In some embodiments, components of the amplifier module or the amplifier module are under observation prior to the failure.

According to an aspect, the at least one parameter is assigned to the operating hours of the amplifier module. Thus, the operating hours of the amplifier module may be taken into account in order to predict the probability and/or time of default of the at least one amplifier module. For instance, a model may be used that predicts the probability and/or time of default by taking the actual operating hours of the amplifier module into account. Alternatively or additionally, a look-up table based on stored empirical data may be used for predicting the probability and/or time of default based on the operating hours. In an embodiment, the look-up table includes one or more data sets stored in a memory.

According to another aspect, the at least one parameter is assigned to a temperature of the amplifier module in combination with another parameter of the at least one amplifier module. The other parameter may correspond to the operating hours of the amplifier module so that the temperature of the amplifier module is taken into account in combination with the operating hours of the amplifier module. Thus, the probability and/or time of default may be predicted due to a temperature behavior being characteristically for the actual operating hours of the amplifier module.

Moreover, the other parameter may correspond to a certain operation mode of the amplifier module or another parameter of the amplifier module that has been acquired. Thus, a temperature rise in a certain operation mode may be analyzed so as to predict the probability and/or time of default.

Furthermore, the at least one parameter may be assigned to a transistor parameter, namely a parameter of the transistor being a component of the amplifier module. The transistor parameter may be an input level, a drain current and/or a gate current, for example wherein the gate current is a common gate current of the amplifier module. The respective transistor parameter corresponds to a parameter that is directly assigned to the transistor of the amplifier module. The behavior of the respective transistor parameter may be acquired and analyzed appropriately for predicting the probability and/or time of default.

Generally, several parameters of the at least one amplifier module may be taken into account simultaneously so as to increase the accuracy of the prediction. In some embodiments, the prediction is based on more information provided that several parameters are acquired and analyzed simultaneously.

According to an aspect, the time dependent behavior of the at least one parameter is analyzed. Thus, an increase or rather a decrease over time of the respective parameter can be identified which may indicate an upcoming default of the at least one amplitude module within the next months.

For instance, an increasing gate current (over time) indicates an upcoming failure or rather default of an associated transistor of the amplifier module within, for example, the next two to three months. In some embodiments, the gate current is substantially zero in the delivery state of the amplifier module so that the value of the gate current can be used as an indication of an upcoming failure or default.

Furthermore, an increasing drain current of a transistor or rather an increasing drain current of the amplifier module may indicate a deterioration or rather failure of a respective component located downstream of the transistor or rather the amplifier module, for instance a (high frequency or rather radio frequency) connection, a cable or a combiner.

In an embodiment, a brazing solder disappears over time in case of high powers processed by the amplifier module, for instance high frequency signals having a power above 2 kW.

Moreover, a high input level, namely between the nominal input level and the maximum input level, in combination with a short-term gate current may indicate a high deterioration of a transistor yielding in a failure within, for example, the next two to six months.

Furthermore, the at least one parameter may be compared with a comparison parameter being of the same type, for example wherein the comparison parameter is acquired from another amplifier module and/or wherein the comparison parameter is a previously acquired parameter. Thus, the actually acquired parameter is compared with a previously acquired one so that a historical behavior or rather a trend can be analyzed appropriately. In case of high deviations, a critical behavior of the respective component may be existent.

Further, the actually acquired parameter may be compared with a comparison parameter derived from another amplifier module that may be located at a comparable position so that substantially the same values are expected due to the comparable positions. Deviations that occur during the comparison may yield an upcoming default.

For instance, drain currents between amplifier modules or rather transistors, namely components of the amplifier module(s), are acquired and compared with each other. Deviations higher than 20% obtained by the comparison may indicate that the component or rather amplifier module having the higher drain current will probably fail within the upcoming four to five months, for example.

According to another aspect, a notification is output when the analysis yields an upcoming default, for example wherein the notification is displayed on a display. Thus, the user of the respective system is informed proactively once a probably upcoming default has been detected by the analysis. Therefore, the user may act proactively and already place an order for the respective component, namely a spare part, used for replacing the prone one.

Moreover, the order may be placed automatically by the system wherein the user is informed about the order, for instance via the display.

For instance, the notification is output by the amplifier module itself, the measurement data acquisition unit, the measurement data analyzing unit and/or an external device. Accordingly, the amplifier module, the measurement data acquisition unit and/or the measurement data analyzing unit may comprise the display. Furthermore, the information may be accessed by the external device or rather transmitted to the external device.

Put another way, the at least one measurement data analyzing unit, the amplifier module, the measurement data acquisition unit and/or an external device may be configured to output a notification indicating the predictive probability and/or time of default of the amplifier module when the analysis yields an upcoming default. The respective component of the system may comprise a display provided that the notification is output graphically via the display.

In fact, the measurement data analyzing unit may communicate with the measurement data acquisition unit and/or the amplifier module itself so that the information with regard to the upcoming default is transmitted to the respective component of the system so that this component may display or rather output the notification.

According to another aspect, the at least one parameter acquired and/or the analysis result is transmitted by telemetry and/or wherein the at least one parameter acquired and/or the analysis result is accessed via a web interface. The at least one parameter acquired may be transmitted to the measurement data acquisition unit, for instance by using a communication according to the MQTT protocol. Thus, telemetry data may be communicated between the amplifier module or rather the superior amplifier system and the measurement data acquisition unit in an automatic manner without any manual input. The transmission by telemetry may correspond to communicating via short message services (SMS) or electronic mail (e-mail). In a similar manner, the analysis result obtained by the at least one measurement data analyzing unit may be transmitted by telemetry.

The analysis result corresponds to the predicted probability and/or time of default of the at least one amplifier module.

Hence, this information may be output by an external device provided that the information is accessed via the web interface or rather the information is transmitted by telemetry. In addition or alternatively, the information is output at the amplifier module itself, the measurement data acquisition unit and/or the measurement data analyzing unit.

Furthermore, the at least one parameter acquired and/or the analysis result may be accessed via a web interface so that the respective information may be gathered via a smartphone, a mobile device, a tablet or rather a notebook.

Generally, the respective information may be submitted via the internet. Hence, the information may be forwarded to the manufacturer of the amplifier module via the internet.

The communication via the internet may be done via a satellite communication using telecommunication standards like long term evolution (LTE) or other telecommunication standards such as the global system for mobile communication (GSM).

A respective universal serial bus (USB) stick may be used for communication purposes. Therefore, the system may comprise a universal serial bus (USB) stick that is assigned to at least one of the amplifier module, the measurement data acquisition unit and the measurement data analyzing unit.

In addition, the measurement data acquisition unit and the measurement data analyzing unit may be integrated in a common device. The common device may relate to a single box that may comprise a single-board computer, an uninterruptable power supply (UPS) wherein the single-board computer may comprise at least one communication interface so that the common device is configured to communicate with the amplifier module.

Alternatively or additionally, a web interface is provided via which the at least one parameter acquired and/or the analysis result can be accessed, for example from remote.

Alternatively or additionally, a telemetry system is provided so that the at least one parameter acquired and/or the analysis result can be transmitted (automatically), for example to remotely located components of the system.

In general, the amplifier module may be assigned to a measurement amplifier, a power amplifier, a broadband amplifier, a low-noise amplifier, a pulse amplifier, and/or an amplifier device.

Generally, the respective communication may be wireless and/or wired.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
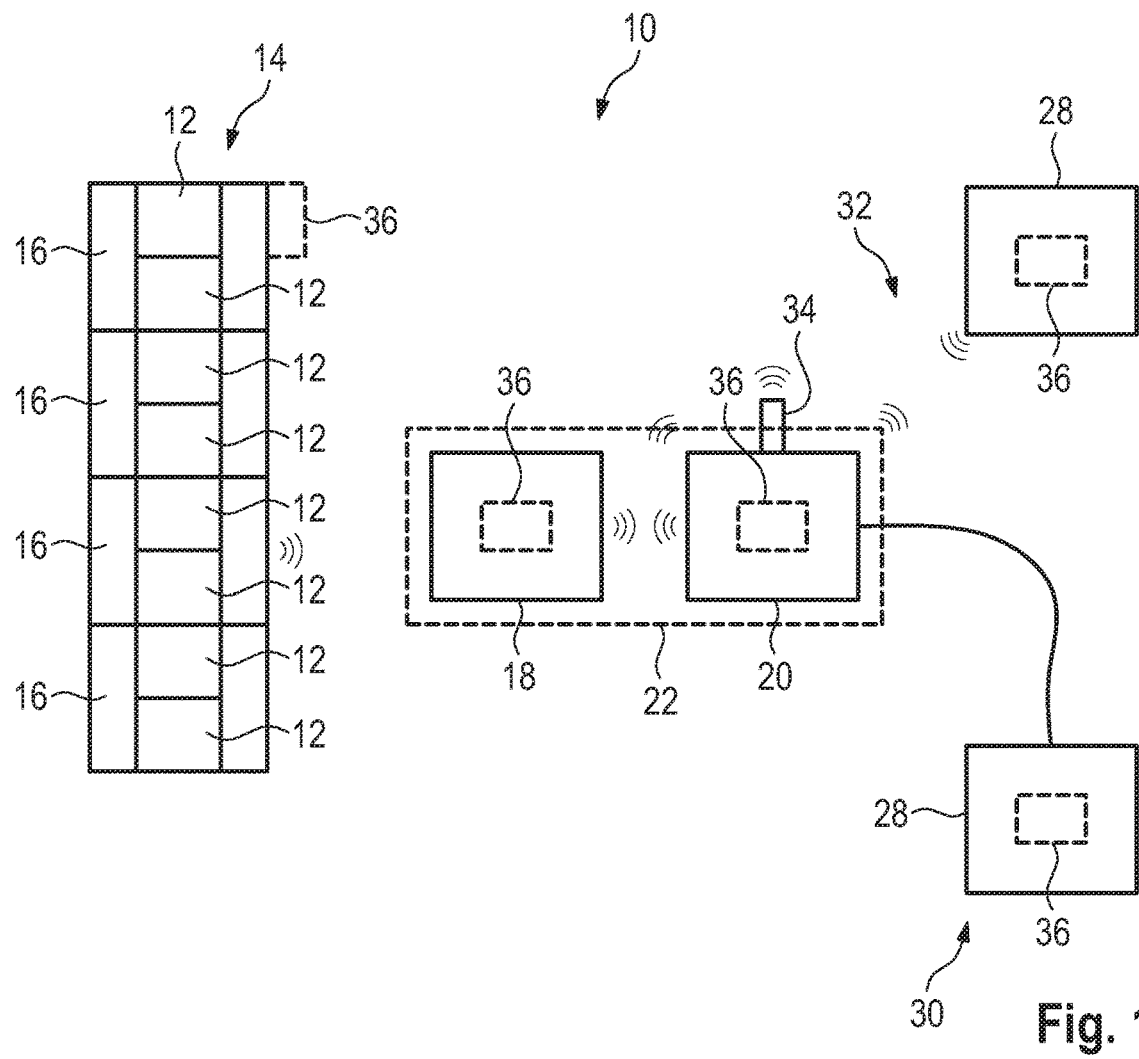
FIG. 1 schematically shows an overview of an example of a system according to the present disclosure.

In FIG. 1, a system 10 for predictive maintenance of an amplifier module 12 is shown. The amplifier module 12 is part of a superior amplifier system 14 that comprises several amplifier devices 16 each having several amplifier modules 12. The amplifier modules 12 or rather the amplifier devices 16 may be installed in a rack or rather a cabinet as schematically shown in FIG. 1.

In addition, the system 10 comprises a measurement data acquisition unit 18 that is configured to communicate with the at least one amplifier module 12 so that at least one parameter of the amplifier module 12 can be acquired. For instance, the amplifier module 12 and the at least one measurement data acquisition unit 18 may communicate with each other via a communication according to the message queuing telemetry transport (MQTT) protocol so that telemetry data of the amplifier module 12 is transmitted to the measurement data acquisition unit 18 in an automatic manner. In some embodiments, the parameter is only transmitted in case that the value of the parameter changes so that the data exchange is minimized.

The system 10 also comprises at least one measurement data analyzing unit 20 that communicates with the measurement data acquisition unit 18 so as to receive the parameter acquired. The at least one measurement data analyzing unit 20 is configured to receive the parameter acquired and to analyze the at least one parameter acquired so as to predict the probability and/or time of default of the at least one amplifier module 12 based on the parameter acquired.

Hence, an expected downtime of the amplifier module 12 can be predicted resulting in a predictive maintenance for the amplifier module 12. This ensures that the user of the amplifier module 12 is enabled to act proactively instead of reacting on an already occurring failure. Therefore, the downtime of the amplifier module 12 or rather the superior amplifier system 14 can be reduced significantly.

Figure 2:
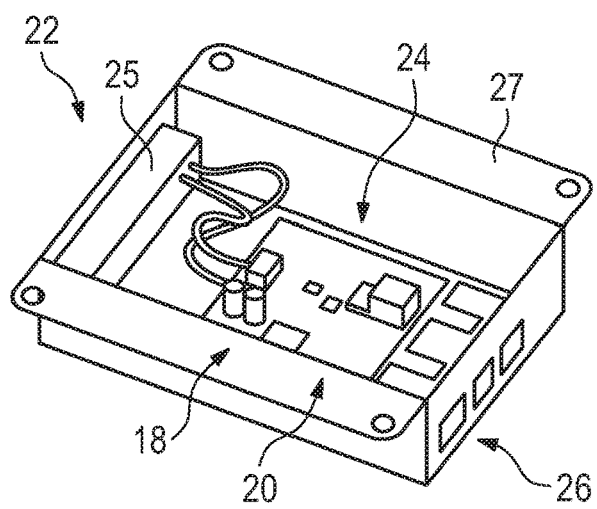
FIG. 2 schematically shows a common device comprising an example of the at least one measurement data acquisition unit as well as an example of the at least one measurement data analyzing unit.

The measurement data acquisition unit 18 as well as the measurement data analyzing unit 20 may be established in a common device 22 as shown in FIG. 2. Furthermore, the measurement data acquisition unit 18 as well as the measurement data analyzing unit 20 may be established in a common manner.

As shown in FIG. 2, the common device 22 comprises a single-board computer 24 that may be configured to establish the measurement data acquisition unit 18 as well as the measurement data analyzing unit 20 simultaneously. In addition, an uninterruptible power supply 25 such as a battery is provided that is connected to the single-board computer 24.

The single-board computer 24 may further comprise a communication interface 26 so that the common device 22 is enabled to communicate with the at least one amplifier module 12 or rather the superior amplifier system 14 as well as external devices 28 such as a computer, a notebook, a mobile device, a tablet or rather a smartphone.

The common device 22 may have a housing 27 that houses the components mentioned above. The housing 27 ensures the required electromagnetic compatibility (EMC). In the shown embodiment, the housing 27 comprises a base part as well as a lid (not shown) that can be fixedly connected with the base part so as to close the space accommodating the single-board computer 24 and the uninterruptible power supply 25. Furthermore, the system 10 may comprise a web interface 30 or rather a telemetry system 32 for establishing the communication, data exchange or rather data access between the respective components of the system 10. For instance, a universal serial bus (USB) stick 34 may be provided being part of the system 10 wherein the universal serial bus stick 34 is assigned to one of the components of the system 10, for instance the common device 22, so as to establish a communication according to a telecommunication standard such as long term evolution (LTE) or global system for mobile communication (GSM).

The web interface 30 ensures that a user of the system 10 can access a certain component of the system 10 so as to retrieve the information desired, for instance the analysis result of the measurement data analyzing unit 20 or rather the acquired parameter by accessing the measurement data acquisition unit 18, the analyzing module 12 or the analyzing system 14 directly.

Furthermore, the respective information may be transmitted by using the telemetry system 32 or rather the communication established by the universal serial bus stick 34.

Hence, the information may be transmitted to the manufacturer of the amplifier module 12 so that the component or rather the amplifier module 12 which is deemed to fail in the near future is ordered directly and automatically. This ensures that the spare part is provided once the amplifier module 12 fails so that the downtime can be reduced significantly.

The system 10 further comprises a display 36 that is used for displaying a notification indicating the predicted probability and/or time of default of the amplifier module 12 when the analysis yields an upcoming default. The display 36 may be assigned to the at least one measurement data analyzing unit 20, the amplifier module 12 itself, the superior amplifier system 14 and/or the external device 28. The respective notification may be output in another way instead of being displayed, for instance acoustically.

Generally, the external device 28 may comprise the measurement data analyzing unit 20 so that the data acquired is analyzed remotely. The external device 28 may be a computer configured to communicate with the measurement data acquisition unit 18.

Alternatively or additionally, the respective data is transmitted to the manufacturer of the amplifier module 12, a service provider or another authorized party via the internet or rather a telecommunication network, for instance the LTE/GSM network. For the communication via the telecommunication network, the respective stick 34 may be used.

Figure 3:
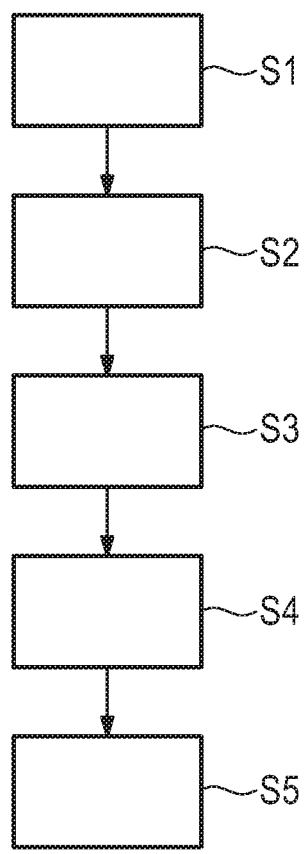
FIG. 3 schematically shows an overview illustrating an example of a method according to the present disclosure.

The system 10 is generally configured to perform a method for performing predictive maintenance of the amplifier module 12 as will be described hereinafter with reference to FIG. 3.

In a first step S1, at least one parameter of the at least one amplifier module 12 is acquired via the measurement data acquisition unit 18. The parameter may be acquired by measuring the at least one parameter or rather by receiving the parameter which is transmitted by the amplifier module 12 in case of a changing value of the respective parameter. In fact, the parameter may be transmitted automatically without any manual input.

In a second step S2, the at least one parameter acquired is analyzed by the measurement data analyzing unit 20 so as to predict the probability and/or time of default of the at least one amplifier module 12 based on the information assigned to the at least one parameter obtained.

Once the analysis yields an upcoming failure, a notification is output in a third step S3 so as to inform the user of the system 10 with regard to the upcoming failure of the amplifier module 12 as well as the remaining time and/or the probability of the upcoming failure.

In a fourth step S4, the failure may be located. This means that a certain component of the complex amplifier module 12 is indicated which probably fails in the near future. The respective location may be output, for example displayed, so that the user gets informed appropriately.

For this purpose, a model of the respective amplifier module 12 may be provided wherein the respective components are shown. The components may be indicated by different colors according to their status. Thus, a component that probably fails within the next months may be colored red so that the user knows which component has to be replaced in the near future.

In a fifth step S5, the system 10 may order automatically a respective spare part for the amplifier module 12 or rather the component thereof that may fail in the near future. This ensures that the respective spare part is on-site once the amplifier module 12 or rather the respective component thereof fails. The downtime of the amplifier module 12 can be reduced significantly.

As indicated above, the at least one parameter used for predictive maintenance may ensure that the upcoming failure or default of the amplifier module 12 is located. For instance, the parameter may be assigned to at least one of the operating hours of the amplifier module 12, a temperature of the amplifier module 12 in combination with another parameter of the amplifier module 12, for instance the operating hours of the amplifier module 12, or rather a transistor parameter of the amplifier module 12. The transistor parameter may correspond to an input level, a drain current and/or a gate current, for example wherein the gate current is a common gate current of the amplifier module.

Accordingly, the amplifier module 12 itself is configured to automatically transmit the respective data related to the parameter. Alternatively or additionally, the measurement data acquisition unit 18 is configured to measure the respective parameter. Hence, the measurement data acquisition unit 18 may comprise a sensor for sensing the parameter, namely a temperature sensor, a current sensor and/or a power sensor.

Moreover, the measurement data analyzing unit 20 receiving the acquired parameter may compare the parameter acquired with a comparison parameter so as to find a deviation which might indicate an upcoming default. The comparison parameter can be a previously acquired value of the same parameter.

Alternatively or additionally, the comparison parameter may correspond to a parameter derived from another amplifier module that may be located at a comparable position.

Irrespective of the comparison parameter used, the time dependent behavior of the at least one parameter may be taken into account for predicting the probability and/or time of default of the at least one amplifier module 12. For instance, an increasing gate current (over time) may indicate that a failure or rather default of an associated transistor of the amplifier module 12 is probably within, for example, the next two to three months.

Moreover, an increasing drain current of a transistor of the amplifier module 12 or rather an increasing drain current of the amplifier module 12 may indicate a deterioration or failure of a respective component located downstream of the transistor or rather the amplifier module 12, for instance a (high frequency or rather radio frequency) connection, a cable or a combiner. For instance, a brazing solder used for the connection may disappear over time in case of high powers processed by the amplifier module 12. Furthermore, a high input level, namely between the nominal input level and the maximum input level, in combination with a short-term gate current may indicate a high deterioration of a transistor yielding in a failure within the next two to six months.

As described above, one or more aspects of the methods set forth herein may be carried out in a computer system. In this regard, program code or a program element is provided, which is configured and arranged when executed on a computer to carry out the functionality described herein. In one embodiment, the program element may specifically be configured to perform one or more of the steps of method claims 1-13 set forth below.

The program element or other program code or instructions described or illustrated herein (e.g., as a method or process step) may be installed in a computer readable storage medium. The computer readable storage medium may be any one of the computers, etc., described elsewhere herein or another and separate computing device, etc., as may be desirable. The computer readable storage medium and the program element, which may comprise computer-readable program code portions embodied therein, may further be contained within a non-transitory computer program product.

As mentioned, various embodiments of the present disclosure may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory and/or the like.

In some embodiments, a volatile computer-readable storage medium may include random access memory (RAM), dynamic random access memory (DRAM), static random access memory (SRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), video random access memory VRAM, cache memory (including various levels), flash memory, register memory, and/or the like. It will be appreciated that where embodiments are described to use a computer-readable storage medium, other types of computer-readable storage media may be substituted for or used in addition to the computer-readable storage media described above As should be appreciated, various embodiments of the present disclosure may also be implemented as methods, apparatus, systems, computing devices, computing entities, and/or the like, as have been described elsewhere herein. As such, embodiments of the present disclosure may take the form of an apparatus, system, computing device, computing entity, and/or the like executing instructions stored on a computer-readable storage medium to perform certain steps or operations. However, embodiments of the present disclosure may also take the form of an entirely hardware embodiment performing certain steps or operations.

Various embodiments are described above with reference to block diagrams and flowchart illustrations of apparatuses, methods, systems, and computer program products. It should also be understood that each block of the block diagrams, flowchart illustrations, and related descriptions, and combinations of blocks in the block diagrams, flowchart illustrations, and related descriptions, could be implemented by special purpose hardware-based computer systems that perform the specified functions or operations, or combinations of special purpose hardware and computer instructions.

It should be understood that any of the block diagrams, flowchart illustrations, and related descriptions, or parts thereof, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks and/or related description. The term computer can include any processing structure, including but is not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

In an embodiment, the measurement data acquisition unit 18, the at least one measurement data analyzing unit 20, and/or other components of the system described herein may include hardware circuit implementations (e.g., implementations in analog circuitry, implementations in digital circuitry, and the like, and combinations thereof) for implementing the functionality described herein. In an embodiment, the measurement data acquisition unit 18, the at least one measurement data analyzing unit 20, and/or other components of the system described herein includes combinations of circuits and computer program products having software or firmware instructions stored on one or more computer readable memories that work together to cause a device to perform one or more methodologies or technologies described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A method for performing predictive maintenance of an amplifier module, comprising:
    acquiring at least one parameter of at least one amplifier module via a measurement data acquisition unit, and
    analyzing the at least one parameter acquired via a measurement data analyzing unit so as to predict the probability and/or time of default of the at least one amplifier module,
    wherein a notification is output when the analysis yields an upcoming default, and wherein the notification is output by at least one of the amplifier module itself, the measurement data acquisition unit, the measurement data analyzing unit and an external device.

2. The method of claim 1, wherein the at least one parameter is assigned to the operating hours of the amplifier module.

3. The method of claim 1, wherein the at least one parameter is assigned to a temperature of the amplifier module in combination with another parameter of the at least one amplifier module.

4. The method of claim 3, wherein the other parameter corresponds to the operating hours of the amplifier module.

5. The method of claim 1, wherein the at least one parameter is assigned to a transistor parameter such as an input level, a drain current and/or a gate current.

6. The method of claim 5, wherein the gate current is a common gate current of the amplifier module.

7. The method of claim 1, wherein the time dependent behavior of the at least one parameter is analyzed.

8. The method of claim 1, wherein the at least one parameter is compared with a comparison parameter being of the same type.

9. The method of claim 8, wherein the comparison parameter is acquired from another amplifier module and/or wherein the comparison parameter is a previously acquired parameter.

10. The method of claim 1, wherein the notification is displayed on a display.

11. The method of claim 1, wherein the at least one parameter acquired and/or the analysis result is transmitted by telemetry and/or wherein the at least one parameter acquired and/or the analysis result is accessed via a web interface.

12. A system for predictive maintenance of an amplifier module, comprising at least one measurement data acquisition unit, at least one measurement data analyzing unit as well as at least one amplifier module,
wherein the at least one measurement data acquisition unit and the at least one measurement data analyzing unit are configured to communicate with each other;
wherein the at least one measurement data acquisition unit is configured to acquire at least one parameter of the at least one amplifier module; and
wherein the at least one measurement data analyzing unit is configured to receive and to analyze the at least one parameter acquired so as to predict the probability and/or time of default of the at least one amplifier module.

13. The system of claim 12, wherein the at least one parameter is assigned to at least one of the operating hours of the amplifier module, a temperature value of the amplifier module in combination with another parameter and a transistor parameter such as an input level, a drain current and/or a gate current.

14. The system of claim 13, wherein the gate current is a common gate current of the amplifier module.

15. The system of claim 12, wherein the at least one measurement data analyzing unit is configured to analyze the time dependent behavior of the at least one parameter.

16. The system of claim 12, wherein the at least one measurement data analyzing unit is configured to compare the at least one parameter with another parameter of the same type that is acquired from another amplifier module and/or a previously acquired parameter.

17. The system of claim 12, wherein the at least one measurement data analyzing unit, the measurement data acquisition unit, the amplifier module and/or an external device are/is configured to output a notification indicating the predicted probability and/or time of default of the amplifier module when the analysis yields an upcoming default.

18. The system of claim 12, wherein the measurement data acquisition unit and the measurement data analyzing unit are integrated in a common device or wherein a web interface and/or a telemetry system are/is provided via which the at least one parameter acquired and/or the analysis result is transmitted and/or accessed.

19. A method for performing predictive maintenance of an amplifier module, comprising:
acquiring at least one parameter of at least one amplifier module via a measurement data acquisition unit, and
analyzing the at least one parameter acquired via a measurement data analyzing unit so as to predict the probability and/or time of default of the at least one amplifier module,
wherein at least one parameter of the amplifier module is taken into account that has been acquired previously so that a predictive maintenance for the amplifier module is provided, wherein the at least one parameter is assigned to a transistor parameter, wherein a model and/or a look-up table based on stored empirical data is used that predicts the probability and/or time of default by taking the actual operating hours of the amplifier module into account, and wherein a notification is output when the analysis yields an upcoming default so as to inform the user of the system with regard to the upcoming failure of the amplifier module as well as the remaining time and/or the probability of the upcoming failure.

* * * * *